United States Patent
Qiao

(10) Patent No.: US 12,051,615 B2
(45) Date of Patent: Jul. 30, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Mengzhu Qiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 414 days.

(21) Appl. No.: 17/445,400

(22) Filed: Aug. 18, 2021

(65) Prior Publication Data
US 2022/0093451 A1    Mar. 24, 2022

Related U.S. Application Data

(63) Continuation of application No. PCT/CN2021/100167, filed on Jun. 15, 2021.

(30) Foreign Application Priority Data

Sep. 18, 2020  (CN) .......................... 202010984302.2

(51) Int. Cl.
*H01L 21/762* (2006.01)
*H01L 21/02* (2006.01)
*H01L 21/8234* (2006.01)

(52) U.S. Cl.
CPC .. *H01L 21/76224* (2013.01); *H01L 21/02164* (2013.01); *H01L 21/02236* (2013.01); *H01L 21/0228* (2013.01); *H01L 21/02282* (2013.01); *H01L 21/76283* (2013.01); *H01L 21/823481* (2013.01)

(58) Field of Classification Search
None
See application file for complete search history.

(56) References Cited

U.S. PATENT DOCUMENTS 5,356,475 A * 10/1994 Diiorio ............... C23C 16/4587
                                                          118/715
6,114,258 A * 9/2000 Miner .................... H01L 21/022
                                                          438/770

(Continued)

FOREIGN PATENT DOCUMENTS

| CN | 101740456 A | 6/2010 |
|---|---|---|
| CN | 102064129 A | 5/2011 |

(Continued)

OTHER PUBLICATIONS

First Office Action of the Japanese application No. 2022-549085, issued on Sep. 5, 2023. 5 pages with English translation.

(Continued)

*Primary Examiner* — Feifei Yeung Lopez
(74) *Attorney, Agent, or Firm* — Syncoda LLC; Feng Ma

(57) ABSTRACT

A method for manufacturing a semiconductor structure includes: a substrate is provided, an isolation trench being formed on the substrate; a silicon-rich isolation layer is formed in the isolation trench, the silicon-rich isolation layer covering an inner surface of the isolation trench; and an isolation oxide layer is formed in the isolation trench. The isolation oxide layer fills up the isolation trench.

9 Claims, 14 Drawing Sheets

(56) References Cited

U.S. PATENT DOCUMENTS

| | | | |
|---|---|---|---|
| 6,586,343 B1* | 7/2003 | Ho | H01L 21/67017 |
| | | | 438/758 |
| 7,947,551 B1 | 5/2011 | Syue | |
| 9,972,525 B2 | 5/2018 | Song et al. | |
| 2004/0203253 A1* | 10/2004 | Yao | H01L 21/02211 |
| | | | 257/E21.268 |
| 2008/0315422 A1* | 12/2008 | Boyd | H01L 25/50 |
| | | | 257/761 |
| 2010/0035402 A1* | 2/2010 | Hirota | H10B 12/318 |
| | | | 257/E21.575 |
| 2011/0115047 A1 | 5/2011 | Hebert | |
| 2012/0153128 A1* | 6/2012 | Roy | H01L 27/14689 |
| | | | 257/E31.127 |
| 2013/0052795 A1* | 2/2013 | Watanabe | H01L 21/76229 |
| | | | 257/E21.546 |
| 2018/0033677 A1 | 2/2018 | Song et al. | |
| 2018/0204750 A1* | 7/2018 | Bhatia | G06T 7/0004 |
| 2021/0119013 A1* | 4/2021 | Chen | H01L 29/66545 |

FOREIGN PATENT DOCUMENTS

| | | |
|---|---|---|
| CN | 104979266 A | 10/2015 |
| CN | 107706090 A | 2/2018 |
| CN | 110707045 A | 1/2020 |
| CN | 110880472 A | 3/2020 |
| JP | 2005259775 A | 9/2005 |
| JP | 2013045946 A | 3/2013 |
| KR | 20070070967 A | 7/2007 |

OTHER PUBLICATIONS

Written Opinion of the International Search Authority in the international application No. PCT/CN2021/100167, mailed on Sep. 13, 2021. 7 pages with English translation.

Supplementary Partial European Search Report in the European application No. 21773280.9, mailed on May 20, 2022.

International Search Report in the international application No. PCT/CN2021/100167, mailed on Sep. 13, 2021. .

First Office Action of the European application No. 21773280.9, issued on Mar. 14, 2023.

* cited by examiner

METHOD FOR MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/100167 filed on Jun. 15, 2021, which claims priority to Chinese Patent Application No. 202010984302.2 filed on Sep. 18, 2020. The disclosures of these applications are hereby incorporated by reference in their entirety.

BACKGROUND

In existing shallow trench isolation (STI) technologies, a shallow trench results in a poor isolation effect, while the smaller size of an active region limits the connection of devices. It is difficult for the process in the related art to deepen the trench while correspondingly increasing the size of the active region. Therefore, a trench structure in the conventional art is difficult to meet performance requirements of a semiconductor structure.

SUMMARY

The disclosure relates generally to the technical field of a semiconductor, and more specifically to a method for manufacturing a semiconductor structure and a semiconductor structure.

The present disclosure provides a method for manufacturing a semiconductor structure and a semiconductor structure to improve the performance of the semiconductor structure.

According to a first aspect of the disclosure, a method for manufacturing a semiconductor structure is provided, including the following operations.

A substrate is provided, an isolation trench being formed on the substrate.

A silicon-rich isolation layer is formed in the isolation trench, the silicon-rich isolation layer covering an inner surface of the isolation trench.

An isolation oxide layer is formed in the isolation trench. The isolation oxide layer fills up the isolation trench.

According to a second aspect of the disclosure, a semiconductor structure is provided, including: a substrate and an isolation oxide layer.

Isolation trenches and a plurality of active regions are formed on the substrate, and the isolation trenches are located between the plurality of active regions.

An isolation oxide layer is located in the isolation trenches and includes a first isolation oxide layer and a second isolation oxide layer, and the first isolation oxide layer covers an inner surface of the isolation trenches.

At least part of the first isolation oxide layer is formed by oxidizing a silicon-rich isolation layer covering the inner surface of the isolation trenches.

BRIEF DESCRIPTION OF THE DRAWINGS

Various objects, features, and advantages of the disclosure will become more apparent from the following detailed description of preferred embodiments of the disclosure when considered in combination with the accompanying drawings. The drawings are only exemplary illustrations of the disclosure and are not necessarily drawn to scale. In the drawings, like reference numerals refer to the same or similar parts throughout.

Figure 1:
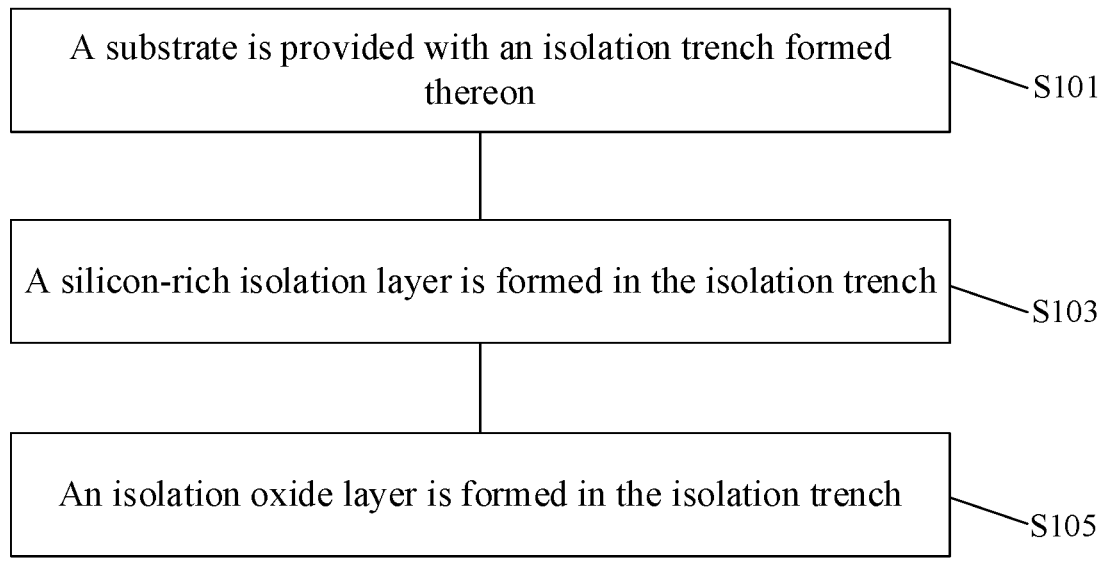
FIG. 1 is a flowchart of a method for manufacturing a semiconductor structure shown according to an exemplary embodiment.

Reference numerals are illustrated as follows.

10, substrate; 11, isolation trench; 111, first isolation trench; 112, second isolation trench; 12, active region; 20, silicon-rich isolation layer; 30, isolation oxide layer; 31, first isolation oxide layer; 32, second isolation oxide layer; 33, first oxide layer; 34, second oxide layer; and 35, third oxide layer.

DETAILED DESCRIPTION

Typical embodiments that embody the features and advantages of the disclosure will be described in detail in the following description. It is to be understood that the disclosure can be changed in different embodiments without departing from the scope of the disclosure, and that the description and drawings are illustrative in nature and are not intended to limit the disclosure.

In the following description of different exemplary embodiments of the disclosure, reference is made to the accompanying drawings, which form a part of the disclosure, and in which different exemplary structures, systems, and steps for implementing various aspects of the disclosure are shown by way of an example. It is to be understood that other specific solutions of a part, a structure, an exemplary device, a system, and a step can be utilized, and a structural and functional modification can be made without departing from the scope of the disclosure. Moreover, although terms "on", "between", "within", etc. can be used in the specification to describe different exemplary features and elements of the disclosure, these terms are used herein for convenience only, for example, according to a direction of the example in the drawings. Any content in the specification should not be construed as requiring a specific three-dimensional direction of the structure to fall within the scope of the disclosure.

An embodiment of the disclosure provides a method for manufacturing a semiconductor structure. Referring to FIG. 1, the method for manufacturing a semiconductor structure includes the following operations.

At S101, a substrate 10 is provided, an isolation trench 11 being formed on the substrate 10.

At S103, a silicon-rich isolation layer 20 is formed in the isolation trench 11, which covers an inner surface of the isolation trench 11.

At S105, an isolation oxide layer 30 is formed in the isolation trench 11.

The isolation oxide layer 30 fills up the isolation trench 11.

According to the method for manufacturing a semiconductor structure of an embodiment of the disclosure, the silicon-rich isolation layer 20 is formed in the isolation trench 11 first, and then the isolation oxide layer 30 is formed. The silicon-rich isolation layer 20 can prevent the substrate 10 from being oxidized in a procedure of forming the isolation oxide layer 30, that is, the finally formed isolation oxide layer 30 does not occupy a region where the active region 12 is located, and the size of the active region 12 is ensured. Moreover, due to an isolation effect of the silicon-rich isolation layer 20, the depth of the isolation trench 11 can be increased under the conditions permitted by a process, thereby enhancing the isolation effect, and improving the performance of the semiconductor structure.

It should be noted that, due to a limitation of an etching process, the size of the isolation trench 11 on the substrate 10 has a limit value, that is, the minimum size is limited. If the size of the isolation trench 11 is etched to the minimum size, at this time, if the isolation oxide layer 30 is formed according to a formation process of the related art, the substrate 10 will be oxidized during the formation of the isolation oxide layer 30, thereby occupying the region where the active region 12 is located. Therefore, it is difficult to deepen the isolation trench 11 by adjusting the etching depth-to-width ratio in the related art while increasing the size of the active region 12 at the same time.

According to the method for manufacturing a semiconductor structure of the disclosure, the silicon-rich isolation layer 20 covering the inner surface of the isolation trench 11 can be formed first in the isolation trench 11 by utilizing the isolation trench 11 with the minimum size, and then the isolation oxide layer 30 is formed. During the formation of the isolation oxide layer 30, even if an oxidation phenomenon occurs, the silicon-rich isolation layer 20 is oxidized, while the substrate 10 is not oxidized.

It should be noted that during the formation of the isolation oxide layer 30, the silicon-rich isolation layer 20 will be oxidized, that is, the isolation oxide layer 30 includes a thin film formed after the silicon-rich isolation layer 20 is oxidized. In the embodiment, after the isolation oxide layer 30 is formed in the isolation trench 11, the whole silicon-rich isolation layer 20 is oxidized as a part of the first oxide layer 30.

A forming process of the isolation oxide layer 30 can be an Atomic Layer Deposition (ALD) process, an In-Situ Steam Generation (ISSG) process, a spin-on dielectric (SOD) process, etc.

In an embodiment, the substrate 10 can be formed of silicon-containing material. The substrate 10 can be formed of any suitable material, for example, including at least one of silicon, monocrystalline silicon, polycrystalline silicon, amorphous silicon, silicon germanium, monocrystalline silicon germanium, polycrystalline silicon germanium, and carbon-doped silicon.

It should be noted that after the isolation trench 11 is etched on the substrate 10, the silicon-rich isolation layer 20 can be formed in the isolation trench 11 by using a chemical vapor deposition (CVD) process. In an embodiment, the operation that an isolation oxide layer 30 is formed in the isolation trench 11 includes that: a first isolation oxide layer 31 is formed in the isolation trench 11, at least part of the first isolation oxide layer 31 is formed by oxidizing the silicon-rich isolation layer 20; and a second isolation oxide layer 32 is formed in the isolation trench 11, in which the second isolation oxide layer 32 covers the first isolation oxide layer 31, and the first isolation oxide layer 31 and the second isolation oxide layer 32 serve as the isolation oxide layer 30.

Specifically, during the formation of the first isolation oxide layer 31, the atomic layer deposition process, the in-situ steam generation process, etc. are adopted, therefore the silicon-rich isolation layer 20 is oxidized, and thus the first isolation oxide layer 31 is formed. That is, in addition to preventing the oxidization of the substrate 10, the silicon-rich isolation layer 20 can finally serve as a part for forming the isolation oxide layer 30. This ensures that the isolation oxide layer 30 has sufficient isolation capability. After the first isolation oxide layer 31 is formed, the second isolation oxide layer 32 covers the first isolation oxide layer 31, and the second isolation oxide layer 32 fills up the remaining space of the isolation trench 11.

In an embodiment, after the first isolation oxide layer 31 is formed in the isolation trench 11, the whole silicon-rich isolation layer 20 is oxidized into the first oxide layer 33. That is, the first isolation oxide layer 31 includes a thin film formed after oxidation of at least part of the silicon-rich isolation layer 20. The first oxide layer 33 formed by the whole oxidized silicon-rich isolation layer 20 ensures that the isolation oxide layer 30 has the sufficient isolation capability.

Specifically, during the formation of the first isolation oxide layer 31, all the silicon-rich isolation layer 20 is oxidized, for example, during the formation of the first isolation oxide layer 31 by using the atomic layer deposition process and the in-situ moisture generation process, the silicon-rich isolation layer 20 is gradually oxidized, and finally, the silicon-rich isolation layer 20 completely forms the first isolation oxide layer 31.

In an embodiment, the operation that the first isolation oxide layer 31 is formed includes that: a second oxide layer 34 is formed in the isolation trench 11, which covers the silicon-rich isolation layer 20, and after the second oxide layer 34 is formed, a part of the silicon-rich isolation layer 20 is oxidized to form the first oxide layer 33; the silicon-rich isolation layer 20 is oxidized by the in-situ steam generation process, after the in-situ steam generation process is finished, at least part of the silicon-rich isolation layer 20 is oxidized to form the first oxide layer 33; and a third oxide layer 35 is formed in the isolation trench 11, which covers the second oxide layer 34, in which after the third oxide layer 35 is formed, the whole silicon-rich isolation layer 20 is oxidized to form the first oxide layer 33. The first oxide layer 33, the second oxide layer 34, and the third oxide layer 35 serve as the first isolation oxide layer 31.

Specifically, a forming procedure of the first isolation oxide layer 31 mainly includes three steps. The second oxide layer 34 is formed first on the surface of the silicon-rich isolation layer 20, during which, a part of the silicon-rich isolation layer 20 can be oxidized. The silicon-rich isolation layer 20 is processed by the in-situ steam generation process. At this time, at least part of the silicon-rich isolation layer 20 is oxidized to form the first oxide layer 33. Finally, the third oxide layer 35 is formed on the surface of the second oxide layer 34, and the silicon-rich isolation layer 20 is completely oxidized to form the first oxide layer 33. The first oxide layer 33, the second oxide layer 34, and the third oxide layer 35 constitute the first isolation oxide layer 31.

In an embodiment, the second oxide layer 34 and the third oxide layer 35 are formed by the atomic deposition process, that is, the second oxide layer 34 is formed on the surface of the silicon-rich isolation layer 20 by the atomic deposition process, and after the silicon-rich isolation layer 20 is oxidized by using the in-situ steam generation process to form the first oxide layer 33, and the third oxide layer 35 is formed on the surface of the second oxide layer 34 by the atomic deposition process.

In an embodiment, the second isolation oxide layer 32 is formed by a spin-on dielectric layer process. That is, after the first isolation oxide layer 31 is formed, the second isolation oxide layer 32 is formed in the isolation trench 11 by the spin-on dielectric layer process, at this time, the unoccupied region of the isolation trench 11 is fully filled, and the second isolation oxide layer 32 covers the first isolation oxide layer 31 located on an upper surface of the substrate 10.

Figure 6:
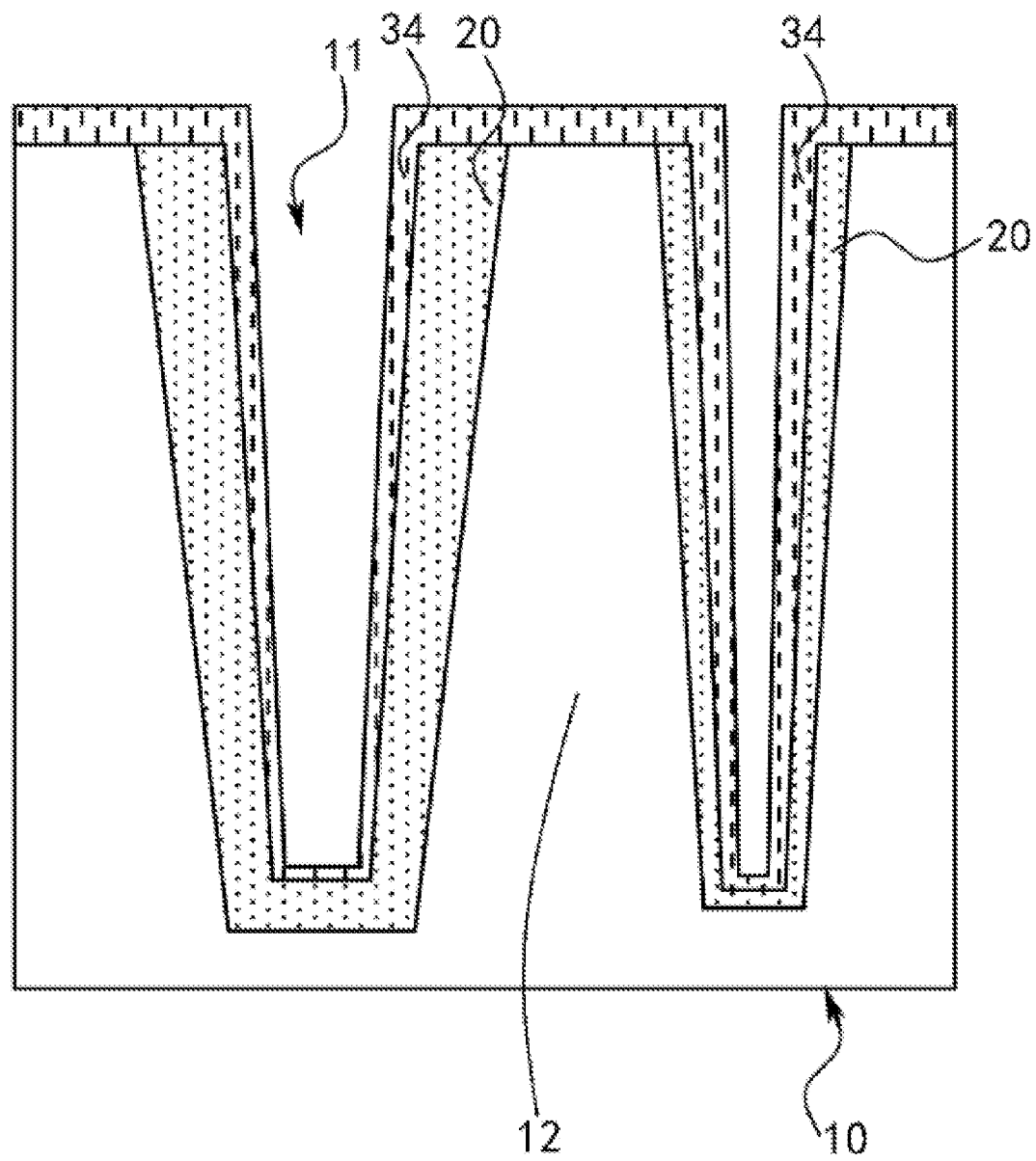
FIG. 6 is a structural schematic diagram of forming a second oxide layer according to a method for manufacturing a semiconductor structure shown in an exemplary embodiment.
Figure 11:
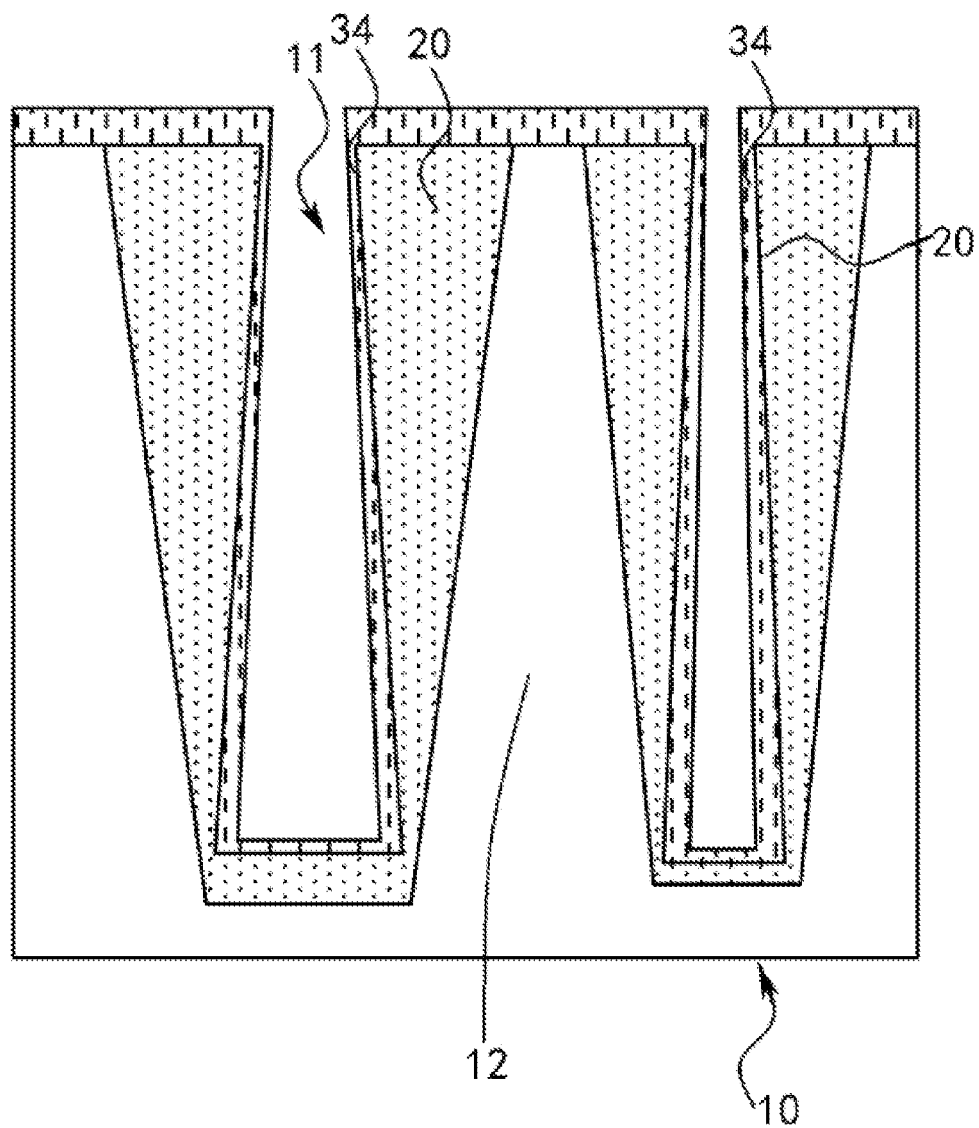
FIG. 11 is a structural schematic diagram of forming a second oxide layer according to a method for manufacturing a semiconductor structure shown in another exemplary embodiment.

It should be noted that the second oxide layer 34 is formed on the surface of the silicon-rich isolation layer 20 and the upper surface of the substrate 10 by the atomic deposition process, specifically, referring to FIG. 6 and FIG. 11. The uniformity of the thin film formed by the atomic deposition process is particularly good, that is, the uniformity of the second oxide layer 34 is ensured to meet the requirement. The silicon-rich isolation layer 20 is oxidized by using the in-situ steam generation process to form the first oxide layer 33 on the inner side of the second oxide layer 34, specifically, referring to FIG. 7 and FIG. 12. The in-situ steam generation process is performed by annealing with $H_2/O_2$, which ensures that most of the silicon-rich isolation layer 20 is oxidized, and the density of the second oxide layer 34 can be increased, therefore the effect of isolating the oxide layer is ensured. The third oxide layer 35 is formed on the inner surface of the second oxide layer 34 and on the second oxide layer 34 on the upper surface of the substrate 10 by the atomic deposition process, specifically, referring to FIG. 8 and FIG. 13. The uniformity of the third oxide layer 35 formed by using the atomic deposition process meets the requirement. Finally, the second isolation oxide layer 32 is formed on the surface of the third oxide layer 35 located on the inner surface of the isolation trench 11 and on the upper surface of the substrate 10 by the spin-on dielectric layer process, specifically, referring to FIG. 9 and FIG. 14. By using the spin-on dielectric layer process, it is ensured that the isolation trench 11 is fully filled, and an annealing process is added subsequently to ensure the formation of silicon oxide.

Figure 2:
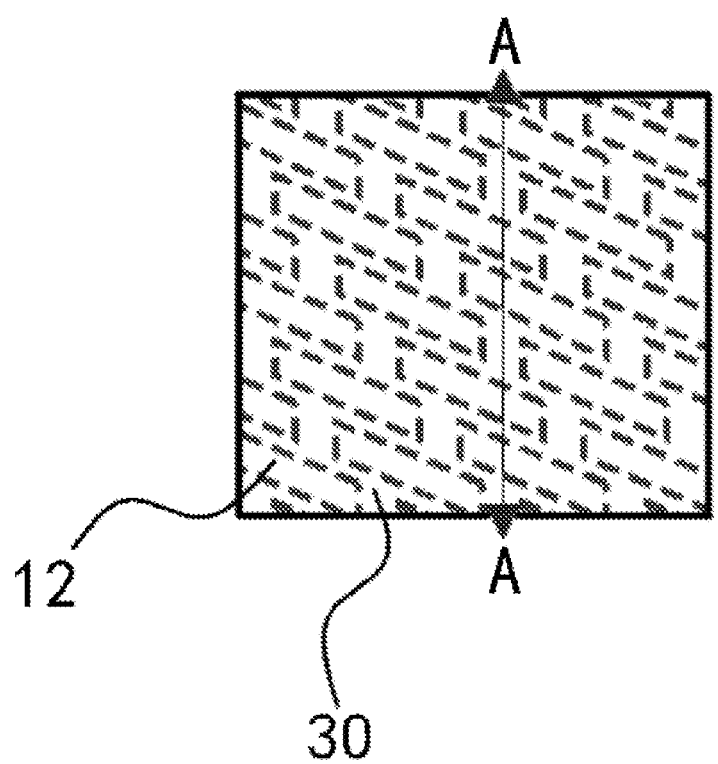
FIG. 2 is a structural top view of a semiconductor structure shown according to an exemplary embodiment.
Figure 3:
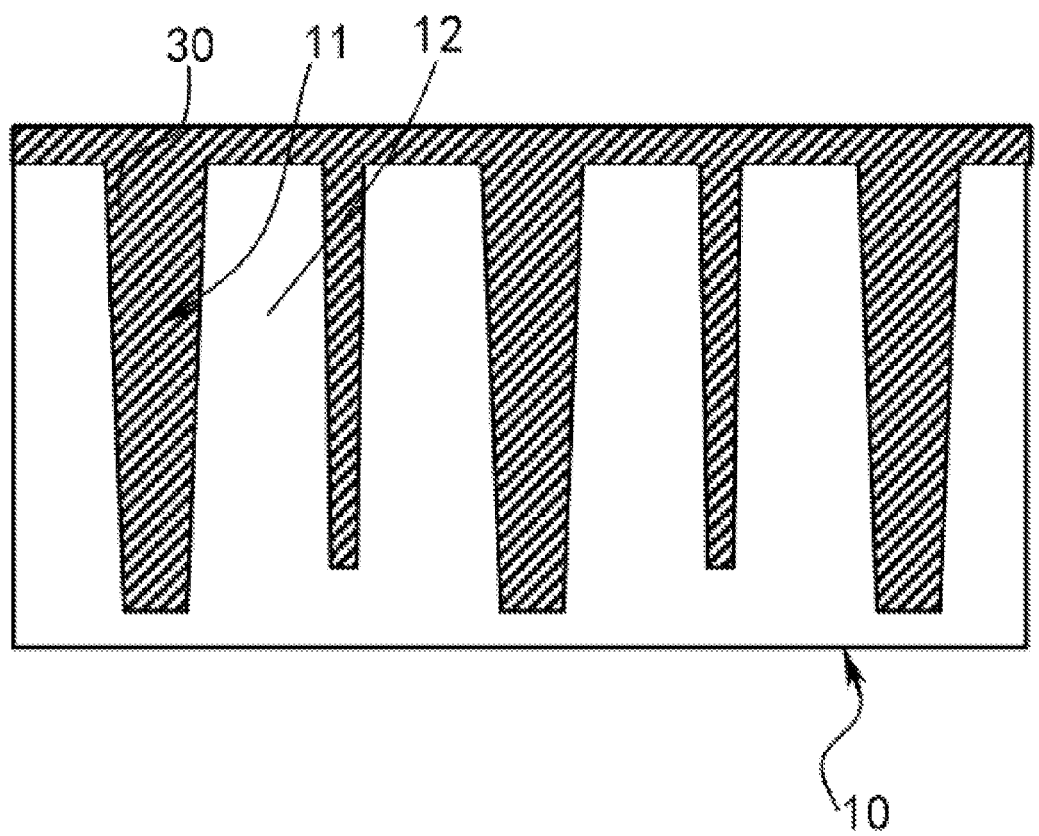
FIG. 3 is a cross-sectional structural view along A-A in FIG. 2.

In an embodiment, as shown in FIG. 2 and FIG. 3, a plurality of active regions 12 are formed on the substrate 10. The isolation trenches 11 are respectively located between the plurality of active regions 12. The isolation trenches 11 include first isolation trenches 111 and second isolation trenches 112. The width of the first isolation trenches 111 is greater than the width of the second isolation trenches 112, and the depth of the first isolation trenches 111 is greater than the depth of the second isolation trenches 112. That is, the filling amount in the first isolation trenches 111 is greater than the filling amount in the second isolation trenches 112.

In an embodiment, the first oxide layer 33, the second oxide layer 34, the third oxide layer 35, and the second isolation oxide layer 32 serve as a first isolation trench oxide layer to fill the first isolation trenches 111. Since the width of the first isolation trenches 111 is greater, the trenches are not filled up after the first oxide layer 33, the second oxide layer 34, and the third oxide layer 35 are formed, therefore the second isolation oxide layer 32 needs to be formed by the spin-on dielectric layer process for filling.

In an embodiment, the first oxide layer 33, the second oxide layer 34, and the third oxide layer 35 serve as a second isolation trench oxide layer to fill the second isolation trenches 112. Since the width of the second isolation trenches 112 is smaller, the second isolation trenches 112 can be fully filled up after the first oxide layer 33, the second oxide layer 34, and the third oxide layer 35 are formed. Of course, it is also not excluded that some of the second isolation trenches 112 are still unfilled after the first isolation oxide layer 31 is formed, which can be filled up by the second isolation oxide layer 32.

In an embodiment, the isolation oxide layer 30 is a silicon dioxide layer.

In an embodiment of the disclosure, the silicon-rich isolation layer 20 is a polycrystalline silicon layer. The polycrystalline silicon layer is oxidized by a subsequent process to form the silicon dioxide layer.

In an embodiment, the silicon-rich isolation layer 20 is formed by a furnace tube process.

In an embodiment, the operation that a silicon-rich isolation layer 20 is formed includes that: $C_6H_{17}NSi$ is introduced into the furnace tube to form a seed crystal on the surface of the isolation trench 11; and $Si_2H_4$ is introduced into the furnace tube to form the silicon-rich isolation layer 20 on the inner surface of the isolation trench 11.

Specifically, the $C_6H_{17}NSi$ is introduced into the furnace tube, the reaction time is controlled to be 8 min-12 min, and the temperature is controlled at 400° C.-440° C., therefore the seed crystal is rapidly grown on the surface of the substrate 10, and in the embodiment, the reaction time is controlled at 10 min, and the temperature is controlled at 420° C. The $Si_2H_4$ is then introduced, the reaction time is controlled to be 8 min-12 min, and the temperature is controlled at 400° C.-440° C. to form the silicon-rich isolation layer 20. In the embodiment, the reaction time is controlled at 10 min, and the temperature is controlled at 420° C.

In an embodiment, the silicon-rich isolation layer 20 covering a sidewall of the isolation trench 11 is equal in thickness from the bottom of the isolation trench 11 to the top of the isolation trench 11, that is, the silicon-rich isolation 20 with the uniform thickness is formed on the surface of the substrate 10.

It should be noted that the thickness of the silicon-rich isolation layer 20 at the bottom end of the isolation trench 11 can also be equal to the thickness of the silicon-rich isolation layer 20 covering the sidewall of the isolation trench 11.

Specifically, the method for manufacturing a semiconductor structure in the embodiment includes the following operation.

Figure 4:
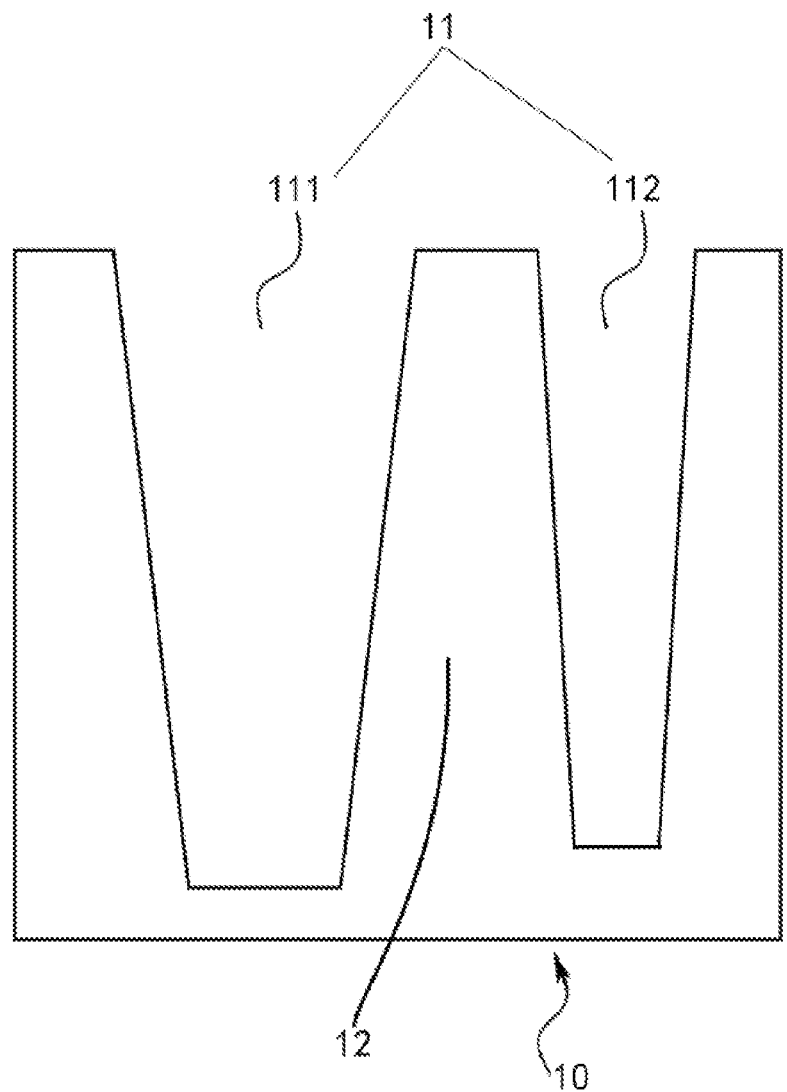
FIG. 4 is a structural schematic diagram of forming an isolation trench according to a method for manufacturing a semiconductor structure shown in an exemplary embodiment.

As shown in FIG. 4, the isolation trench 11 is etched on the substrate 10. The isolation trench 11 includes the first isolation trench 111 and the second isolation trench 112, the depth and width of the first isolation trench 111 are greater than the depth and width of the second isolation trench 112, the depth of the first isolation trench 111 can be 260 nm-300 nm, and the depth of the second isolation trench 112 can be 225 nm-265 nm.

Figure 5:
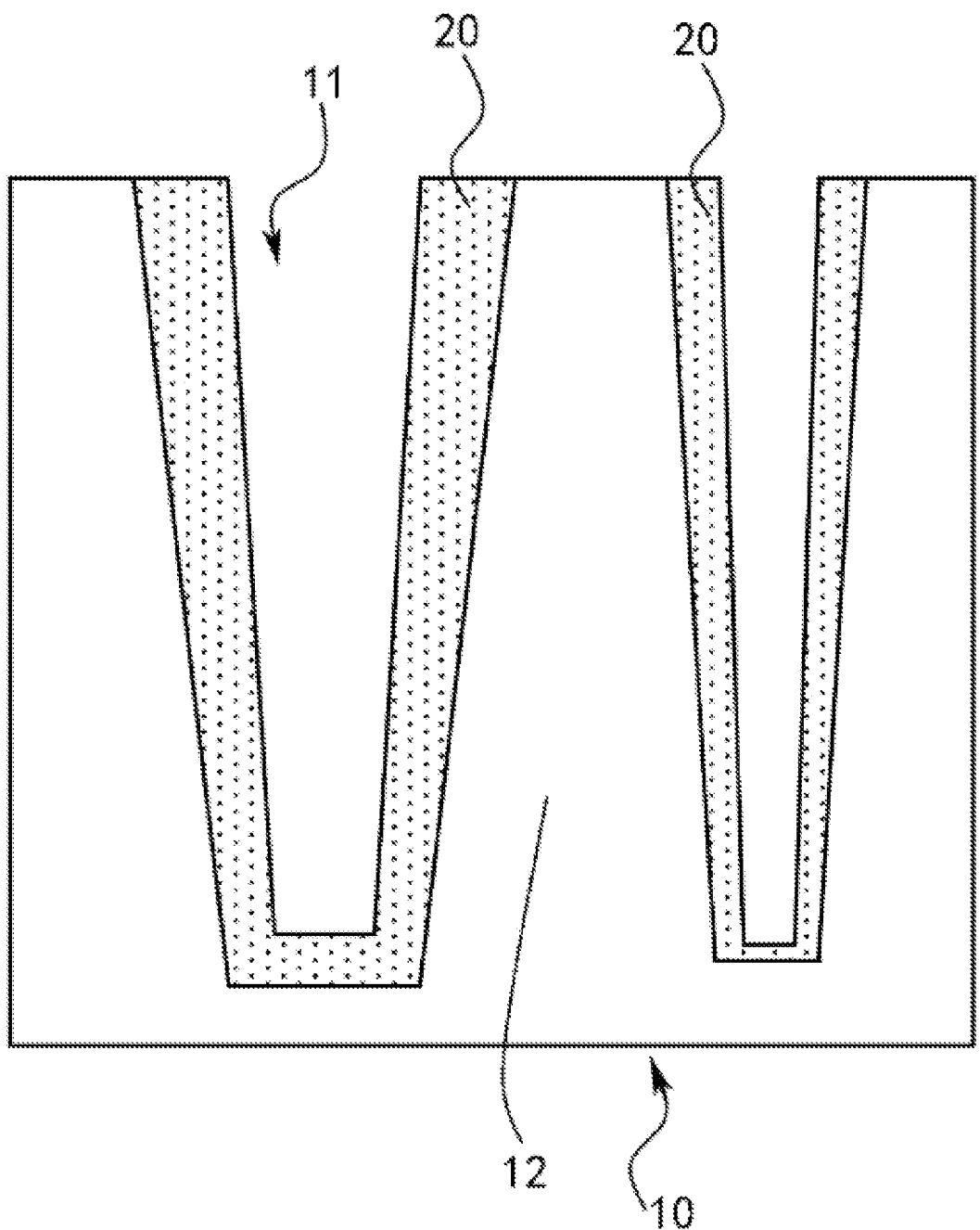
FIG. 5 is a structural schematic diagram of forming a silicon-rich isolation layer according to a method for manufacturing a semiconductor structure shown in an exemplary embodiment.

On the basis of FIG. 4, the silicon-rich isolation layer 20 is formed in the isolation trench 11 by using a chemical vapor deposition process, as shown in FIG. 5, the thickness of the silicon-rich isolation layer 20 is consistent, and the thickness of the silicon-rich isolation layer 20 can be 2.3 nm-3.1 nm.

On the basis of FIG. 5, the second oxide layer 34 is formed on the surface of the silicon-rich isolation layer 20 and on the upper surface of the substrate 10 by using the atomic layer deposition process, as shown in FIG. 6, in the procedure, a part of the silicon-rich isolation layer 20 is oxidized (since a small part of the silicon-rich isolation layer 20 is oxidized in the procedure, the oxidized part of the silicon-rich isolation layer 20 is not shown in FIG. 6).

Figure 7:
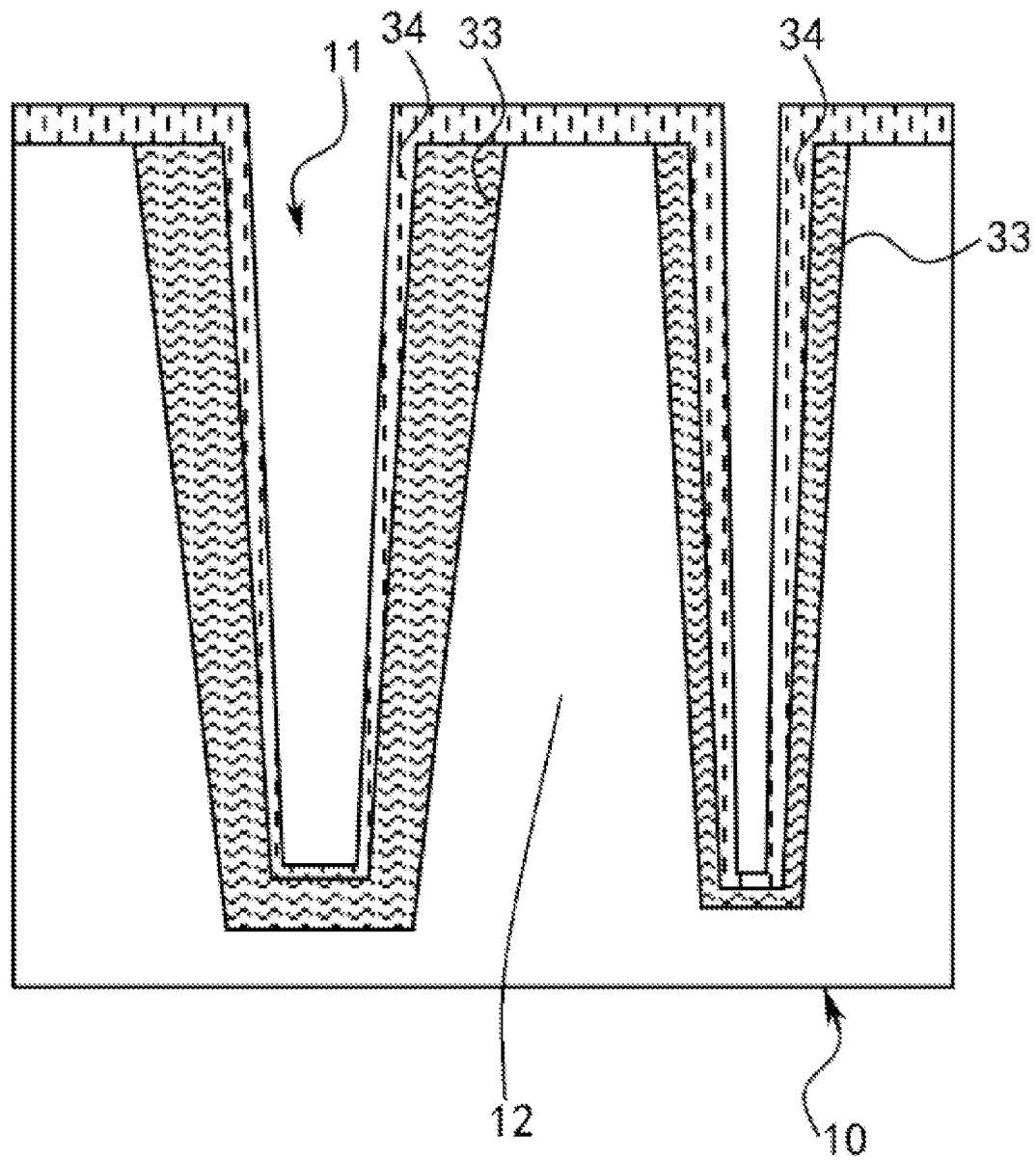
FIG. 7 is a structural schematic diagram after an in-situ steam generation process according to a method for manufacturing a semiconductor structure shown in an exemplary embodiment.

On the basis of FIG. 6, the silicon-rich isolation layer 20 is oxidized by using the in-situ steam generation process to form the first oxide layer 33, as shown in FIG. 7, that is, at least part of the silicon-rich isolation layer 20 is oxidized to form the first oxide layer 33 (in the embodiment of FIG. 7, the silicon-rich isolation layer 20 is fully oxidized by the in-situ steam generation process).

Figure 8:
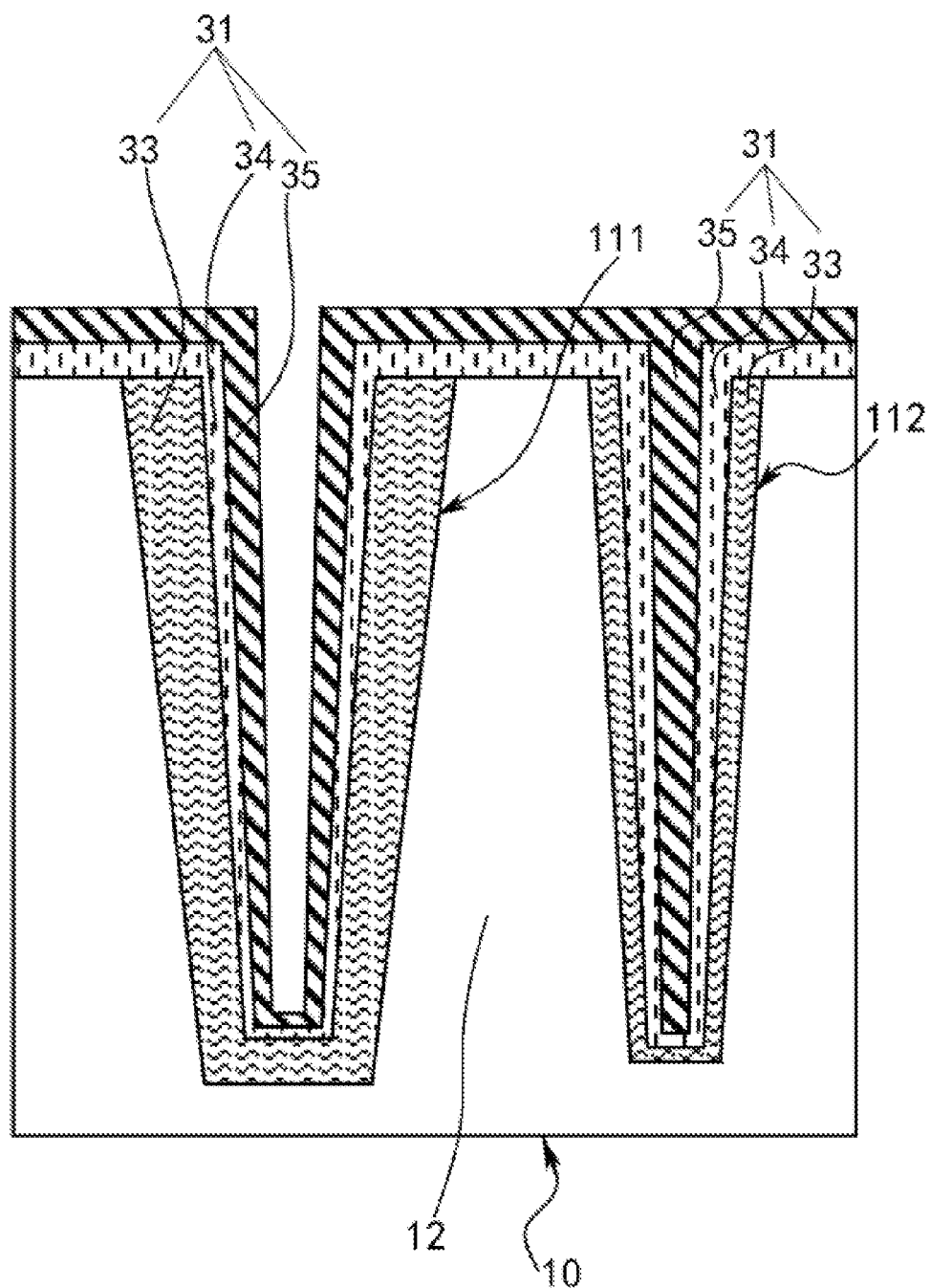
FIG. 8 is a structural schematic diagram of forming a third oxide layer according to a method for manufacturing a semiconductor structure shown in an exemplary embodiment.

On the basis of FIG. 7, the third oxide layer 35 is formed by using the atomic layer deposition process, as shown in FIG. 8, if the unoxidized silicon-rich isolation layer 20 exists after the in-situ steam generation process, the unoxidized part is fully oxidized in the procedure. The first oxide layer 33, the second oxide layer 34, and the third oxide layer 35 serve as the first isolation oxide layer 31.

Figure 9:
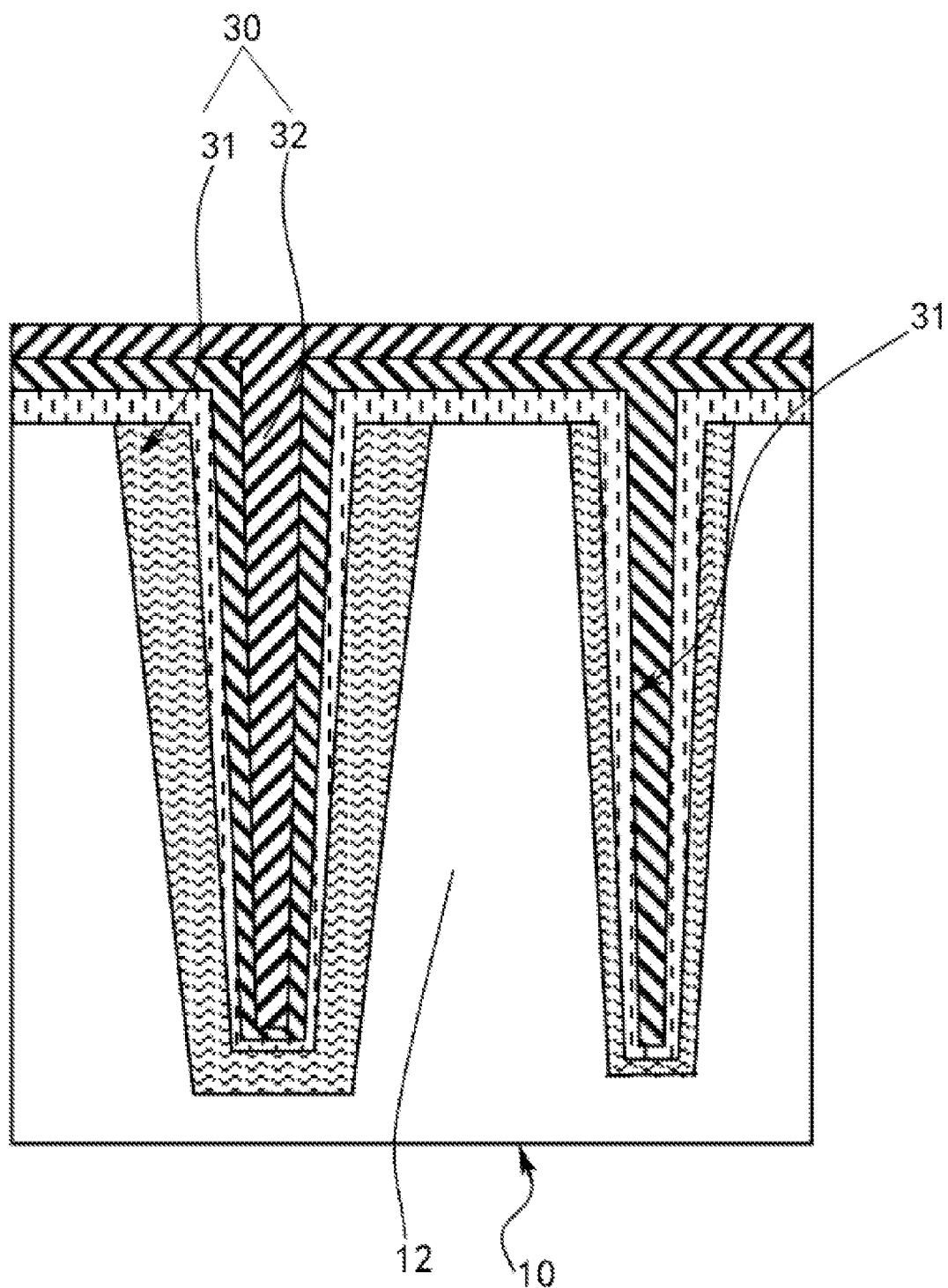
FIG. 9 is a structural schematic diagram of forming a second isolation oxide layer according to a method for manufacturing a semiconductor structure shown in an exemplary embodiment.

On the basis of FIG. 8, the second isolation oxide layer 32 is formed by using the spin-on process, as shown in FIG. 9, the first isolation oxide layer 31 and the second isolation oxide layer 32 serve as the isolation oxide layer 30 to fill up the isolation trench 11, that is, the semiconductor structure shown in FIGS. 2 and 3 is finally formed. The isolation oxide layer 30 is constituted by the same material, for example, silicon oxide.

It should be noted that after the first isolation oxide layer 31 is formed, the second isolation trench 112 is fully filled. The second isolation oxide layer 32 is configured to fill the first isolation trench 111 and to cover a part of the first isolation oxide layer 31 located on the upper surface of the substrate 10.

In an embodiment, the silicon-rich isolation layer 20 covering a sidewall of the isolation trench 11 is gradually increased in thickness from the bottom of the isolation trench 11 to the top of the isolation trench 11, that is, the silicon-rich isolation 20 with the gradually changed thickness is formed on the surface of the substrate 10.

In an embodiment, the silicon-rich isolation layer 20 is formed by a low step coverage furnace tube process, therefore the silicon-rich isolation layer 20 with the gradually changed thickness can be formed on the surface of the substrate 10.

It should be noted that the silicon-rich isolation layer 20 located on an upper part of the isolation trench 11 has the largest thickness, while the silicon-rich isolation layer 20 located on a lower part of the isolation trench 11 has the smallest thickness. Limited by the manufacturing process, the silicon-rich isolation layer 20 located on the upper part of the isolation trench 11 is oxidized faster in the subsequent processes, therefore this structure can ensure the simultaneous oxidation of the silicon-rich isolation layer 20 without the problem of oxidizing the substrate 10.

Specifically, the method for manufacturing a semiconductor structure in the embodiment includes the following operation.

The isolation trench 11 is etched in the substrate 10. A specific structure and size of the isolation trench 11 can be referred to a structure shown in FIG. 4, which will not be described in detail herein.

Figure 10:
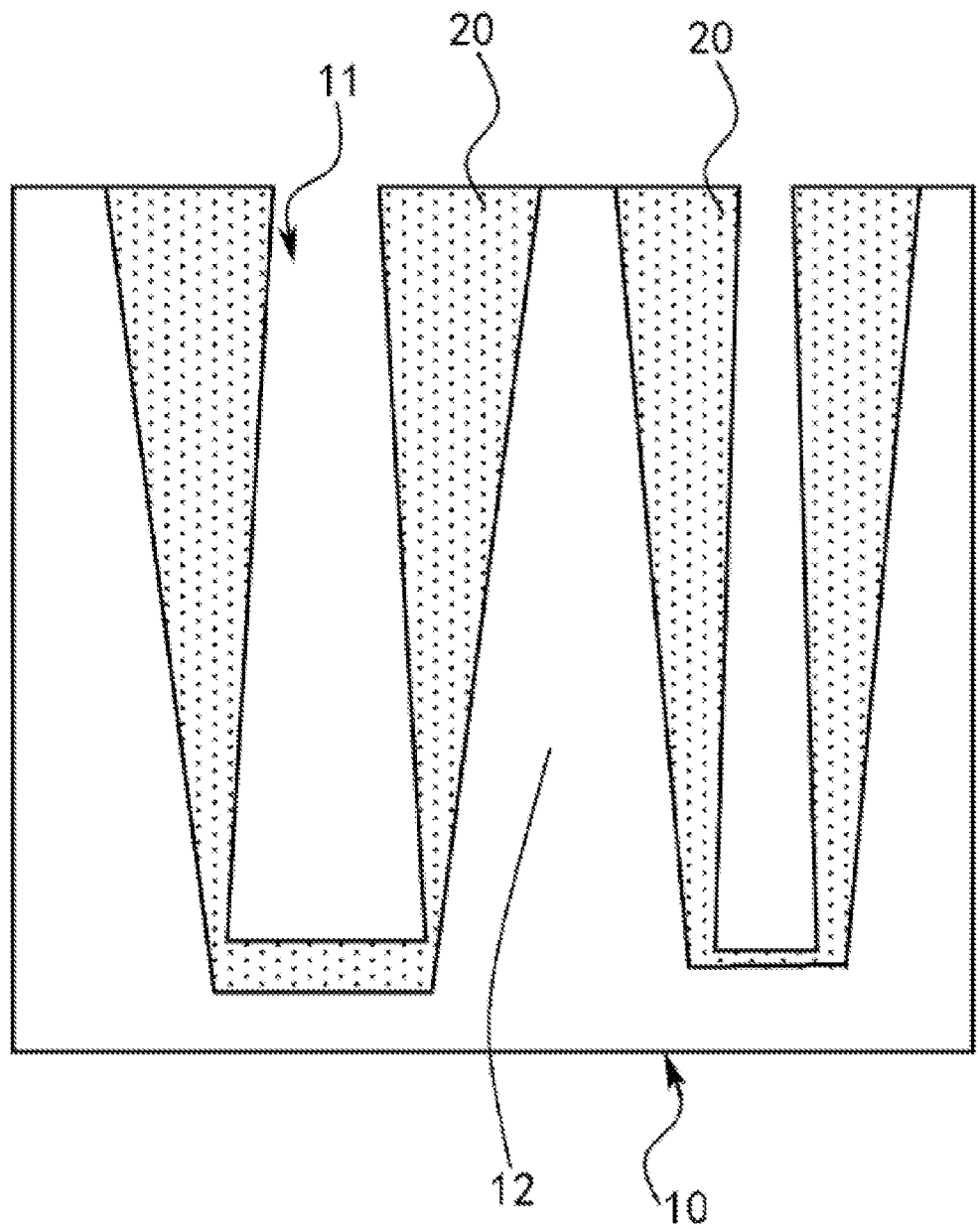
FIG. 10 is a structural schematic diagram of forming a silicon-rich isolation layer according to a method for manufacturing a semiconductor structure shown in another exemplary embodiment.

On the basis of FIG. 4, the silicon-rich isolation layer 20 is formed in the isolation trench 11 by using the chemical vapor deposition process, as shown in FIG. 10. The thickness of the silicon-rich isolation layer 20 is of a gradually changed structure, and the thickness of the silicon-rich isolation layer 20 can be 2.3 nm-3.1 nm. In the embodiment, the thickness of the silicon-rich isolation layer 20 located at the upper part of the isolation trench 11 can be 2.8 nm-3.1 nm, the thickness of the silicon-rich isolation layer 20 located in the middle part of the isolation trench 11 can be 2.6 nm-2.9 nm, and the thickness of the silicon-rich isolation layer 20 located on the bottom of the isolation trench 11 can be 2.3 nm-2.7 nm.

On the basis of FIG. 10, the second oxide layer 34 is formed on the surface of the silicon-rich isolation layer 20 and on the upper surface of the substrate 10 by using the atomic layer deposition process, as shown in FIG. 11, in the procedure, a part of the silicon-rich isolation layer 20 is oxidized (Since a small part of the silicon-rich isolation layer 20 is oxidized in the procedure, the oxidized part of the silicon-rich isolation layer 20 is not shown in FIG. 11).

Figure 12:
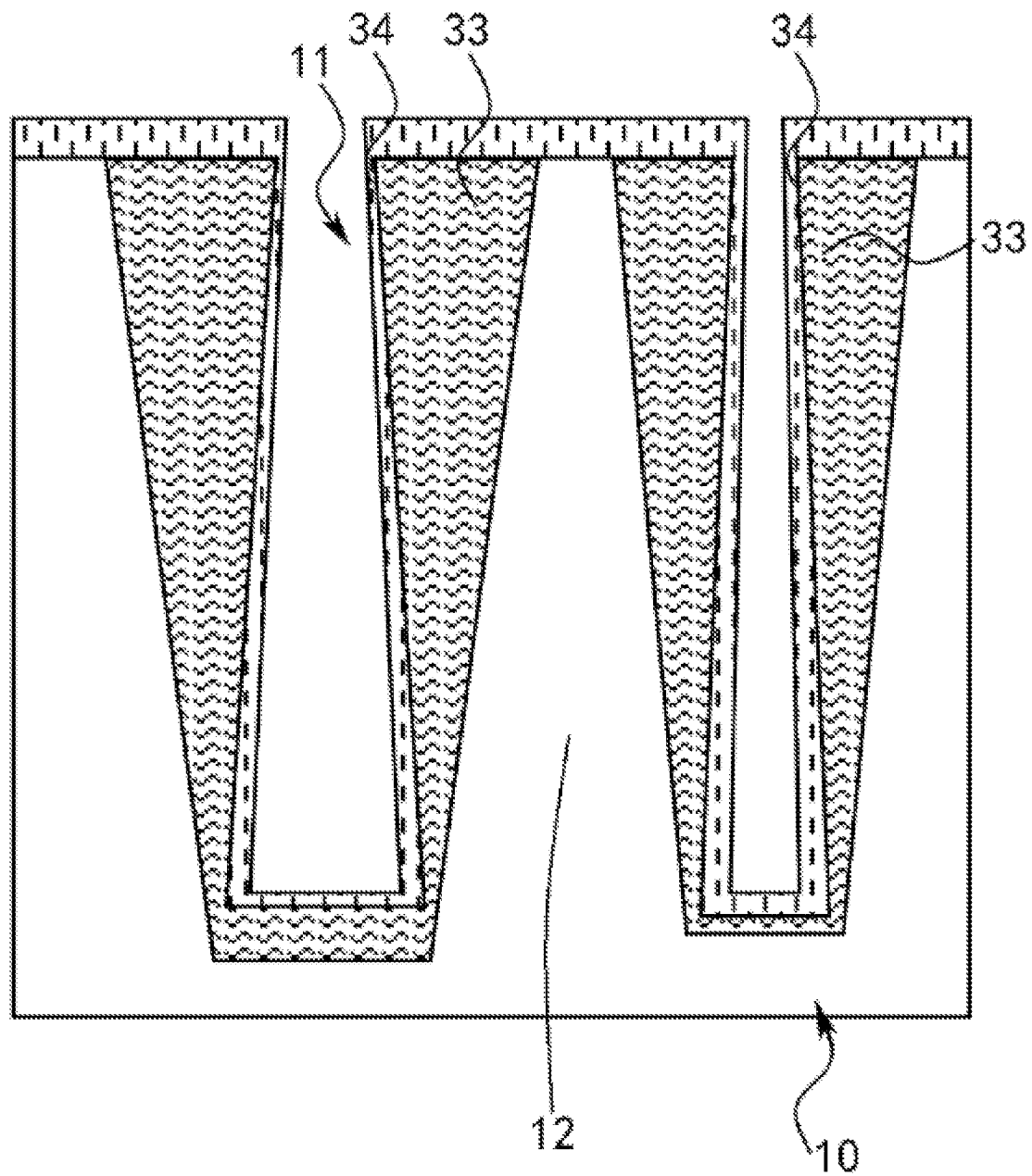
FIG. 12 is a structural schematic diagram after an in-situ steam generation process according to a method for manufacturing a semiconductor structure shown in another exemplary embodiment.

On the basis of FIG. 11, the silicon-rich isolation layer 20 is oxidized by using the in-situ steam generation process to form the first oxide layer 33, as shown in FIG. 12. That is, at least part of the silicon-rich isolation layer 20 is oxidized to form the first oxide layer 33 (in the embodiment of FIG. 12, the silicon-rich isolation layer 20 is fully oxidized by the in-situ steam generation process).

Figure 13:
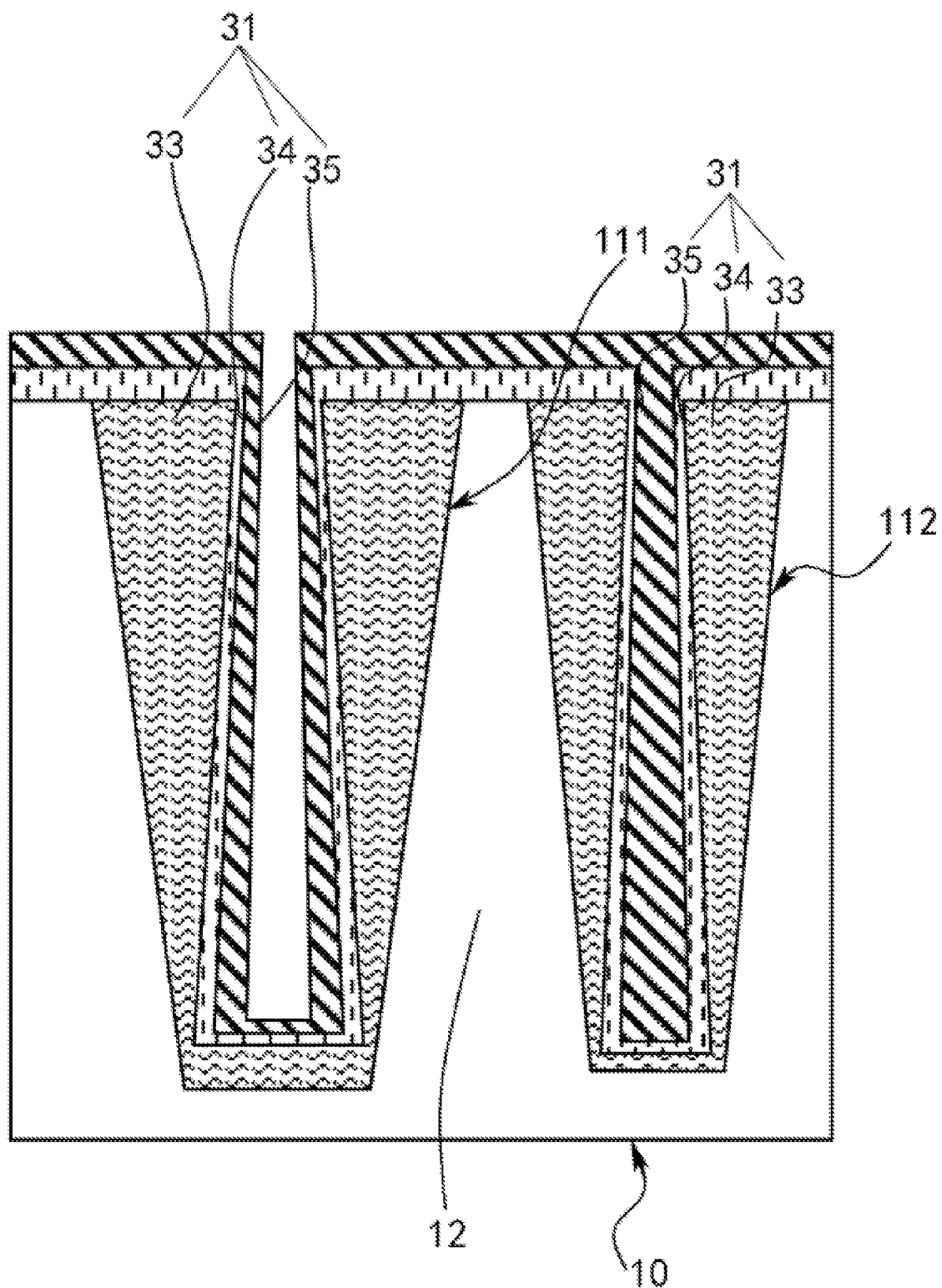
FIG. 13 is a structural schematic diagram of forming a third oxide layer according to a method for manufacturing a semiconductor structure shown in another exemplary embodiment.

On the basis of FIG. 12, the third oxide layer 35 is formed by using the atomic layer deposition process, as shown in FIG. 13. If the unoxidized silicon-rich isolation layer 20 exists after the first oxide layer 33 is formed, the unoxidized part is fully oxidized in the procedure. The first oxide layer 33, the second oxide layer 34, and the third oxide layer 35 serve as the first isolation oxide layer 31.

Figure 14:
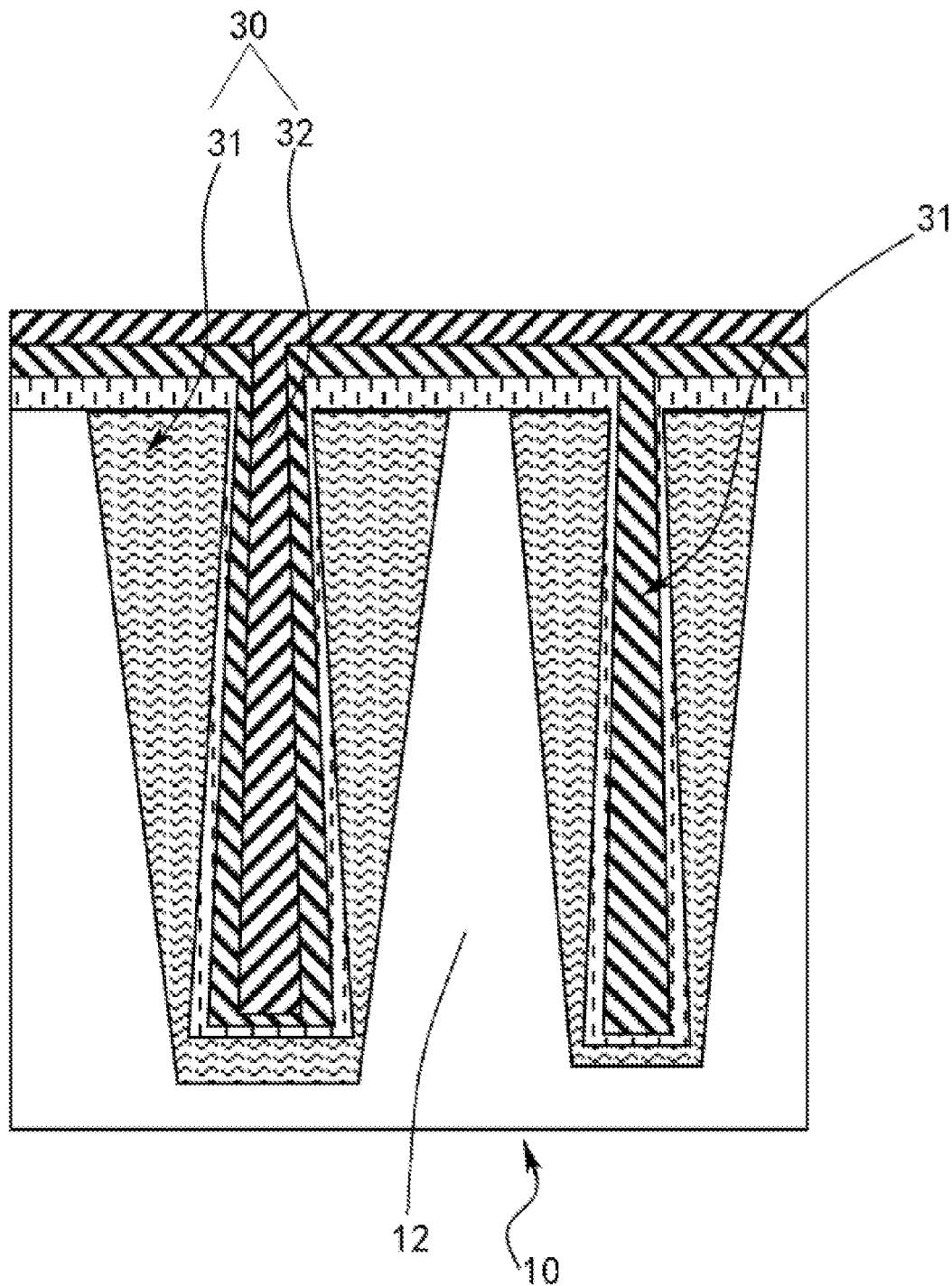
FIG. 14 is a structural schematic diagram of forming a second isolation oxide layer according to a method for manufacturing a semiconductor structure shown in another exemplary embodiment.

On the basis of FIG. 13, the second isolation oxide layer 32 is formed by using the spin-on process, as shown in FIG. 14, and the first isolation oxide layer 31 and the second isolation oxide layer 32 serve as the isolation oxide layer 30 to fill up the isolation trench 11, that is, the semiconductor structure shown in FIGS. 2 and 3 is finally formed. The isolation oxide layer 30 is constituted by the same material, for example, silicon oxide.

It should be noted that after the first isolation oxide layer 31 is formed, the second isolation trench 112 is fully filled. The second isolation oxide layer 32 is configured to fill the first isolation trench 111 and to cover a part of the first isolation oxide layer 31 located on the upper surface of the substrate 10.

In some embodiments, when the silicon-rich isolation layer 20 is oxidized by the in-situ steam generation process, a part of the silicon-rich isolation layer 20 may not be oxidized, and when the third oxide layer 35 is subsequently formed by the atomic layer deposition process, the unoxidized silicon-rich isolation layer 20 is fully oxidized to the first oxide layer 33.

It should be noted that in the semiconductor structure of FIG. 9 and FIG. 14, the first isolation oxide layer 31 and the second isolation oxide layer 32 filled in the isolation trench 11 are of the same in material. That is, the isolation oxide layer 30 constituted by the first isolation oxide layer 31 and the second isolation oxide layer 32 can be silicon oxide, specifically, as shown in FIG. 2 and FIG. 3. FIG. 4 to FIG. 14 focus on illustration of the manufacturing process of a semiconductor structure and any of them does not represent the final form of the semiconductor structure.

According to the method for manufacturing a semiconductor structure, the isolation trench is filled with the polycrystalline silicon before the silicon dioxide is filled, therefore silicon in the active region is prevented from being oxidized by subsequent in-situ steam generation process. Therefore, the length and the width of the active region are increased while effectively increasing the depth of the isolation trench. According to the obtained semiconductor structure, the isolation effect is improved to a certain extent, and the area of the active region is also increased.

An embodiment of the disclosure further provides a semiconductor structure, referring to FIG. 2, FIG. 3, FIG. 9, and FIG. 14. The semiconductor structure includes: a substrate 10, on which isolation trenches 11 and a plurality of active regions 12 are formed, in which the isolation trenches 11 are respectively located between the plurality of active regions 12; and an isolation oxide layer 30, which is located in the isolation trench 11, and includes a first isolation oxide layer 31 and a second isolation oxide layer 32, in which the first isolation oxide layer 31 covers an inner surface of the isolation trench 11, and at least part of the first isolation oxide layer 31 is formed by oxidizing a silicon-rich isolation layer 20 covering the inner surface of the isolation trench 11.

The isolation oxide layer 30 of the semiconductor structure of an embodiment of the disclosure is formed by the first isolation oxide layer 31 and the second isolation oxide layer 32, and at least part of the first isolation oxide layer 31 is formed by the oxidized silicon-rich isolation layer 20 covering the inner surface of the isolation trench 11. That is, the isolation oxide layer 30 in the isolation trenches 11 of the semiconductor structure does not occupy the regions where the active regions 12 are located, thereby ensuring the size of the active regions 12. Moreover due to an isolation effect of the silicon-rich isolation layer 20, the depth of the isolation trenches 11 can be increased under the allowable conditions of the processes, thereby enhancing the isolation effect, and improving the performance of the semiconductor structure.

In an embodiment, the silicon-rich isolation layer 20 can be polycrystalline silicon layer, and the isolation oxide layer 30 can be silicon dioxide.

In an embodiment, as shown in FIG. 4, the isolation trench 11 includes a first isolation trench 111 and a second isolation trench 112, and the width of the first isolation trench 111 is greater than the width of the second isolation trench 112. The first isolation trench 111 is filled with the first isolation oxide layer 31 and the second isolation oxide layer 32, and the second isolation trench 112 is filled with the first isolation oxide layer 31, specifically, referring to FIG. 8, FIG. 9, FIG. 13, and FIG. 14.

In an embodiment, the semiconductor structure is formed by the above method for manufacturing a semiconductor structure.

Other embodiments of the disclosure will be apparent to those skilled in the art after consideration of the specification and practice of the disclosure disclosed here. The disclosure is intended to cover any variations, uses, or adaptations of the disclosure, and the variations, uses, or adaptations follow the general principles of the disclosure and include common general knowledge or conventional technical means in the art undisclosed by the disclosure. The specification and examples are considered as examples only, and a true scope and spirit of the disclosure are indicated by the foregoing claims.

It will be appreciated that the disclosure is not limited to the exact structure that has been described above and illustrated in the accompanying drawings, and that various modifications and changes can be made without departing from the scope thereof. The scope of the disclosure is only limited by the appended claims.

What is claimed is:

1. A method for manufacturing a semiconductor structure, comprising:
   providing a substrate having an isolation trench;
   forming a silicon-rich isolation layer in the isolation trench, the silicon-rich isolation layer covering an inner surface of the isolation trench; and
   forming an isolation oxide layer in the isolation trench, comprising:
   forming a first isolation oxide layer in the isolation trench; and
   forming a second isolation oxide layer in the isolation trench, the second isolation oxide layer covering the first isolation oxide layer, and the first isolation oxide layer and the second isolation oxide layer serving as the isolation oxide layer;
   forming a second oxide layer in the isolation trench, the second oxide layer covering the silicon-rich isolation layer, during which, a part of the silicon-rich isolation layer is oxidized;
   wherein the silicon-rich isolation layer is processed by an in-situ steam generation process, at this time, at least part of the silicon-rich isolation layer is oxidized into a first oxide layer;
   forming a third oxide layer in the isolation trench, the third oxide layer covering the second oxide layer, wherein after the third oxide layer is formed, the silicon-rich isolation layer is completely oxidized into the first oxide layer, and the first oxide layer, the second oxide layer, and the third oxide layer serving as the first isolation oxide layer, wherein,
   the second oxide layer and the third oxide layer are formed by an atomic deposition process; and
   wherein, the isolation oxide layer fills up the isolation trench.

2. The method for manufacturing a semiconductor structure of claim 1, wherein
   the isolation trench comprises a first isolation trench and a second isolation trench, and a width of the first isolation trench is greater than a width of the second isolation trench, wherein the first oxide layer, the second oxide layer, the third oxide layer and the second isolation oxide layer serve as a first isolation trench oxide layer to fill the first isolation trench, and the first oxide layer, the second oxide layer and the third oxide layer serve as a second isolation trench oxide layer to fill the second isolation trench.

3. The method for manufacturing a semiconductor structure of claim 1, wherein
the second isolation oxide layer is formed by a spin-on dielectric layer process.

4. The method for manufacturing a semiconductor structure of claim 1, wherein
the isolation oxide layer is a silicon dioxide layer.

5. The method for manufacturing a semiconductor structure of claim 1, wherein
the silicon-rich isolation layer is a polycrystalline silicon layer.

6. The method for manufacturing a semiconductor structure of claim 1, wherein
the silicon-rich isolation layer covers a sidewall of the isolation trench from a bottom of the isolation trench to a top of the isolation trench, in which the silicon-rich isolation layer has an uniform thickness.

7. The method for manufacturing a semiconductor structure of claim 1, wherein
the silicon-rich isolation layer covers a sidewall of the isolation trench from a bottom of the isolation trench to a top of the isolation trench, in which the silicon-rich isolation layer has an increasing thickness.

8. The method for manufacturing a semiconductor structure of claim 7, wherein
the silicon-rich isolation layer is formed by a low step coverage furnace tube process.

9. The method for manufacturing a semiconductor structure of claim 8, wherein
said forming the silicon-rich isolation layer comprises:
introducing $C_6H_{17}NSi$ into a furnace tube to form a seed crystal on a surface of the isolation trench; and
introducing $Si_2H_4$ into the furnace tube to form the silicon-rich isolation layer on the inner surface of the isolation trench.

* * * * *